United States Patent [19]

Dedic

[11] Patent Number: 4,963,837

[45] Date of Patent: Oct. 16, 1990

[54] AMPLIFIERS

[75] Inventor: Ian J. Dedic, Northolt, England

[73] Assignee: The General Electric Company, p.l.c., England

[21] Appl. No.: 360,005

[22] Filed: Jun. 1, 1989

[30] Foreign Application Priority Data

Jun. 6, 1988 [GB] United Kingdom ................. 8813349

[51] Int. Cl.[5] ................................................ H03F 3/30

[52] U.S. Cl. .................................... 330/264; 330/253; 330/255; 330/259; 330/265

[58] Field of Search ............... 330/253, 259, 264, 265, 330/270, 255

[56] References Cited

FOREIGN PATENT DOCUMENTS 647847 2/1979 U.S.S.R. .............................. 330/265

2194697 3/1988 United Kingdom ................ 330/253

*Primary Examiner*—James B. Mullins

*Attorney, Agent, or Firm*—Kirschstein, Ottinger, Israel & Schiffmiller

[57] ABSTRACT

A high current drive integrated circuit amplifier in which the quiescent currents in the output transistors are controlled by control current signals which are applied to respective input signal amplifiers and which are of values determined by currents flowing in respective current sensing transistors associated with the output transistors. The control arrangement ensures that the output transistors can not be driven to a non-conducting condition.

4 Claims, 2 Drawing Sheets

16 $V_{DD}$ 6 8 1 10 12 4 5 3 11 9 2 7 14 $V_{SS}$

AMPLIFIERS

BACKGROUND OF THE INVENTION

1. Field of the Invention

The present invention relates to amplifiers.

In particular, although not exclusively the invention relates to high current drive integrated circuit amplifiers.

2. Description of Related Art

Amplifiers capable of delivering output currents much higher than their quiescent currents tend to have complicated circuits, including additional amplifier stages within the main amplifier loops to control the quiescent currents. These additional amplifier stages introduce their own speed and stability problems, since they have to be separately stabilised, and any offsets within these additional amplifier stages can lead to ill-defined quiescent currents in the main amplifier.

SUMMARY OF THE INVENTION

According to one aspect of the present invention in a push-pull amplifier comprising a pair of output transistors of opposite conductivity type having their major current paths connected in series across an energising supply and respective amplifier circuit means to provide drive signals to each of said pair of output transistors in dependence upon an input signal to the amplifier, there are provided means to sense the currents flowing in each of said pair of output transistors and control circuit means responsive to the value of those currents to provide control signals of substantially equal magnitude and opposite sense to said respective amplifier circuit means such as to establish quiescent values for the currents flowing in said pair of output transistors.

Preferably the control circuit means includes means effectively to prevent either of said pair of output transistors from being driven to a non-conducting condition.

The means to sense the currents flowing in each of said pair of output transistors may comprise respective current sensing transistors each connected to receive the drive signals provided for the respective output transistors.

According to another aspect of the present invention an integrated circuit push-pull amplifier comprises a pair of output transistors of opposite conductivity type having their major current paths connected in series across an energising supply, a pair of current sensing transistors of opposite conductivity type each having its input electrodes connected, in common with the input electrodes of the output transistor of corresponding conductivity type, to the output of a respective input signal amplifier, and means to control the quiescent currents flowing in said output transistors in dependence upon values of current flowing in said current sensing transistors.

Preferably the means to control said quiescent currents is arranged to supply current control signals to said respective input signal amplifiers of substantially equal magnitude but of opposite sense.

BRIEF DESCRIPTION OF THE DRAWINGS

An amplifier in accordance with the present invention will now be described by way of example with reference to the accompanying drawings, of which.

DETAILED DESCRIPTION OF THE PREFERRED EMBODIMENT

Figure 1:
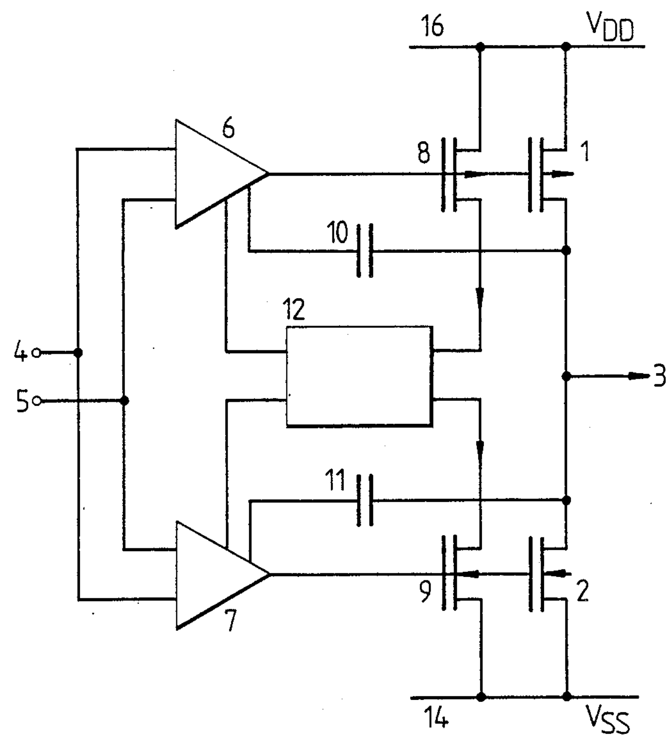
FIG. 1 shows the circuit of the amplifier schematically.

Referring first to FIG. 1, the amplifier is shown as a CMOS integrated circuit amplifier, although the invention could equally be applied to bipolar transistor amplifier circuits. The amplifier comprises a complementary pair of output transistor devices 1 and 2 which are arranged to source or sink output currents to or from a load (not shown) connected to an output path 3 in dependence upon input signal voltages applied differentially between input terminals 4 and 5. Voltage amplifiers 6 and 7 are arranged to apply drive voltages dependent upon these input signal voltages to respective output devices 1 and 2, the drive voltage provided by the amplifier 6 being applied in common to the gate electrode of the output device 1 and that of a current sensing transistor 8, and the drive voltage provided by the amplifier 7 being applied in common to the gate electrode of the output device 2 and that of a current sensing transistor 9. Individual compensation capacitors 10 and 11 are provided between the output path 3 and the output circuits of the amplifiers 6 an 7.

Figure 2:
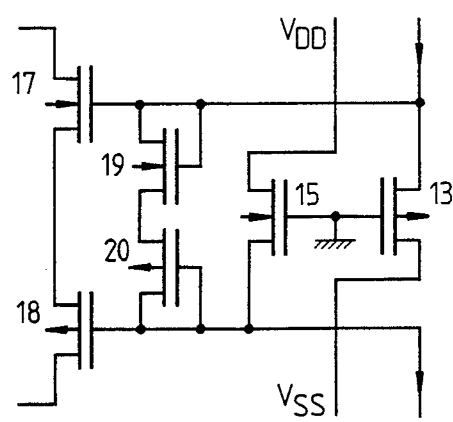
FIG. 2 shows part of the circuit of FIG. 1 diagrammatically.

A quiescent current control circuit 12, shown diagrammatically in FIG. 2, is arranged to draw a current of a predetermined value between a point in the output circuit of the amplifier 6 and a corresponding point in the output circuit of the amplifier 7, which predetermined current value serves to set the quiescent current levels in the output devices 1 and 2 and the respective current sensing transistors 8 and 9.

The circuit 12 comprises a p-channel transistor 13 the source to drain path of which connected between the drain electrode of the p-channel sensing transistor 8 and a negative supply line 14, and an n-channel transistor 15 the source to drain path of which is connected between the drain electrode of the n-channel sensing transistor 9 and a positive supply line 16, the gate electrodes of the transistors 13 and 15 being connected to earth. The source electrode of the transistor 13 is connected to the gate electrode of an n-channel transistor 17 and the source electrode of the transistor 15 is connected to the gate electrode of a p-channel transistor 18, the drain to source and source to drain paths respectively of these transistors 17 and 18 providing the path for the current of predetermined value referred to above. An n-channel transistor 19 and a p-channel transistor 20 have their source electrodes connected together, the gate and drain electrodes of transistor 19 being connected together and to the source electrode of the transistor 13, and the gate and drain electrodes of transistor 20 being connected together and to the source electrode of the transistor 15.

Figure 3:
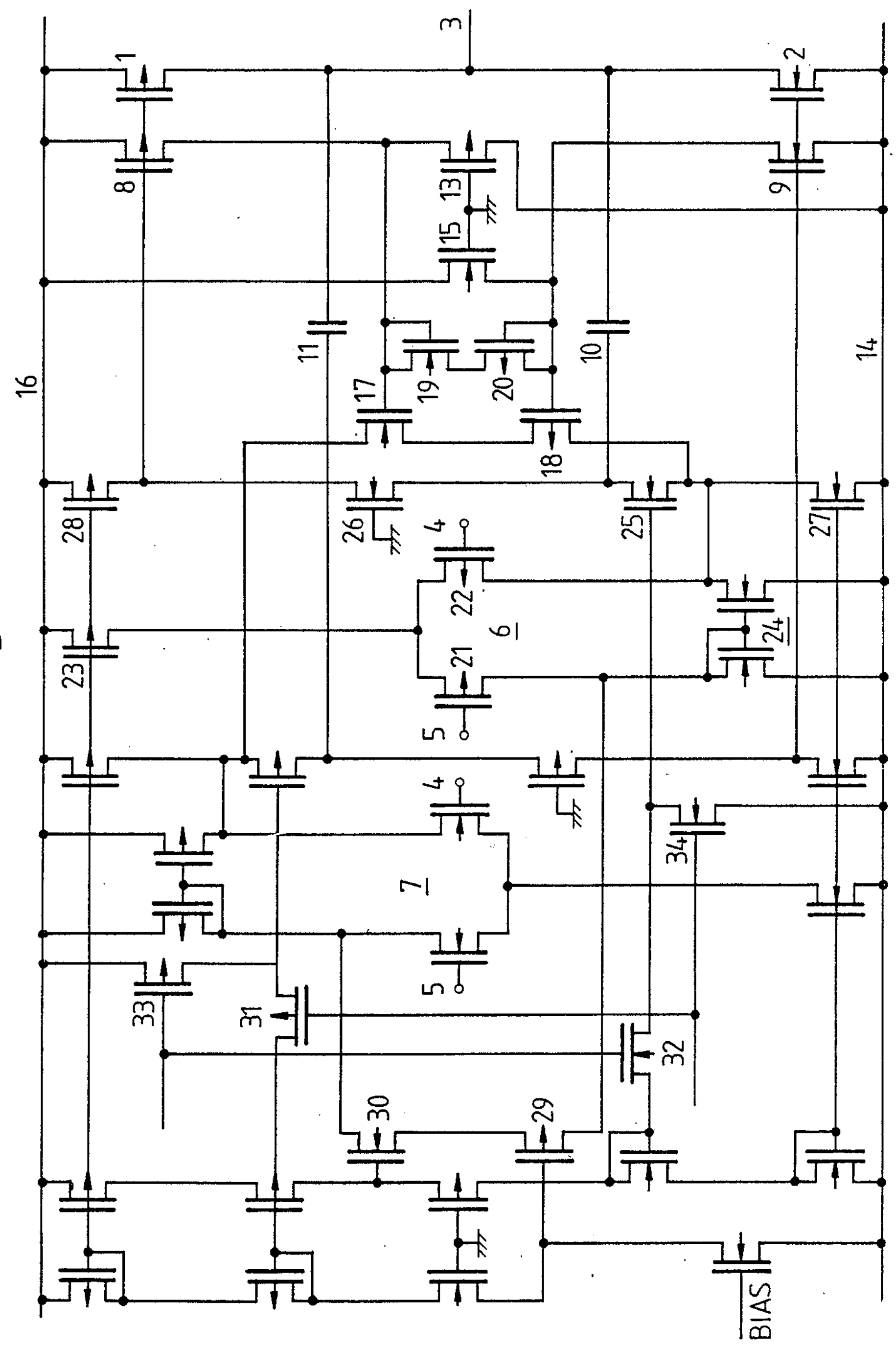
FIG. 3 shows substantially the whole circuit of the amplifier diagrammatically.

Referring now to FIG. 3 the amplifiers 6 and 7 are of similar form but with the polarity of all transistors reversed. Thus the amplifier 6 comprises a long-tail pair of p-channel transistors 21 and 22 whose source electrodes are connected to a constant current source comprising transistor 23 and whose drain electrodes are connected to an active load in the form of a current mirror circuit 24. An output from the drain electrode of the transistor 22 is applied to the gate electrodes of the transistors 8 and 1 by way of cascoded transistors 25 and 26, which are connected between the negative and positive supply lines 14 and 16 by way of constant current sink and source transistors 27 and 28 respectively. The current path through the transistors 17 and 18 is connected between the drain electrode of the transistor 22 and the corresponding point in the amplifier 7, while the compensating capacitor 10 is connected to the source electrode of the transistor 26. A similar current path is provided between the drain electrode of the transistor 21 and the corresponding point in the amplifier 7 by way of a complementary pair of transistors 29 and 30.

The current sensing transistors 8 and 9 are much smaller than the respective output transistors 1 and 2, and draw correspondingly smaller currents. However since all four transistors in general operate in the region of saturation the drain currents of the sensing transistors 8 and 9 in operation are proportional to their gate drive voltages, as are the drain currents of the respective output transistors 1 and 2. The currents flowing through the sensing transistors 8 and 9 in general flow partly in common through the transistors 19 and 20 and partly through respective transistors 13 and 15. The sum of gate/source voltages concomitant with the current flow in these transistors 13 and 15, 19 and 20, provides a forward bias between the gate electrodes of the transistors 17 and 18.

If the drive voltage to either output transistor 1 or 2 rises, so that the current in that transistor and in the corresponding sensing transistor 8 or 9 rises, the forward bias between the gate electrodes of the transistors 17 and 18 tends to rise, as does the current flow through these transistors. Any such increase in current flow in transistors 17 and 18 will leave a smaller proportion of the constant current flow through, say, the transistor 27 to be drawn through the cascode transistors 25 and 26, thus reducing the drive voltage to the transistors 8 and 1. The sense of the feedback around this loop will therefore tend to maintain substantially constant the voltage across the transistors 19 and 20 and the current through the transistors 17 and 18.

In the absence of input signal voltages between the terminals 4 and 5 the current feedback loop determines substantially equal quiescent current flow values in the output transistors 1 and 2, and in the associated current sensing transistors 8 and 9. If the transistors 13 and 15, 17 and 18 and 19 and 20 are of similar size, the quiescent current flow through the sensing transistors 8 and 9 will tend to split equally to flow half through the transistors 13 and 15 respectively and half in common through the transistors 19 and 20.

In the presence of an increasing input signal voltage between the terminals 4 and 5 the decreasing value of drive voltage to, say, the transistors 9 and 2 will tend to decrease the value of current flowing in the sensing transistor 9, and increase that in the sensing transistor 8, to the point where current flow in the transistor 15 tends to cut off. However, a current of half the quiescent value will continue to flow through the transistors 19 and 20, maintained in value by the current feedback loop, so that the drive voltage actually delivered to the gate electrodes of the transistors 9 and 2, by virtue of the current feedback loop and the nature of the output circuits of the amplifiers 6 and 7, can never reduce the current flow through the sensing transistor 9, say, to less than half the quiescent value.

Since the quiescent current control circuit 12 has currents as input and output, with no internal voltage gain or high impedance nodes, no compensation is required within it. Large output currents are possible because of the large drive voltages which may be set up in the output stages of the amplifiers 6 and 7. Any offsets between the amplifiers are corrected by the quiescent current control circuit 12.

In order for the amplifier as a whole to be stable when driving large output currents the voltages across the compensation capacitors 10 and 11 should not vary with output current. This is achieved by connecting each of these capacitors to a low impedance node in the cascode output circuit of the respective amplifier 6 or 7. The cascode transistor 26 having its gate electrode connected to earth improves power supply rejection, by making the voltage across the compensation capacitor 10 less dependent upon power supply voltage.

The transistors 29 and 30 are arranged to draw a current between the drain electrode of the transistor 21 in the amplifier 6 and the corresponding point in the amplifier 7 substantially to balance the current drawn through the transistors 17 and 18.

Additional transistors 31 to 34 are provided to "power down" the amplifier, that is, to turn the output transistors 1 and 2 off by biasing the cascode output stages of the amplifiers 6 and 7 off.

I claim:

1. A complementary symmetry metal oxide semiconductor (CMOS) integrated circuit push-pull amplifier, comprising: first and second field effect output transistors of opposite conductivity type; energizing supply means; means connecting the current paths of said output transistors in series across said energizing supply means; first and second input circuit means for applying input signal voltages to said first and second output transistors respectively; a control current path connected between said first and second input circuit means; and feedback means responsive to the value of current flow through said first and second output transistors to maintain substantially constant the value of current flow through said control current path, said feedback means including means to effect substantially a predetermined value of current flow in common through said first and second output transistors.

2. An integrated circuit push-pull amplifier in accordance with claim 1, wherein the feedback means includes first and second current sensing field effect transistors respectively connected to receive the input signal voltages applied to the first and second output transistors.

3. An integrated circuit push-pull amplifier in accordance with claim 1, wherein the control current path comprises a pair of field effect transistors of opposite conductivity type having their current paths connected in series between the first and second input circuit means.

4. An integrated circuit push-pull amplifier in accordance with claim 3, wherein said means to effect substantially a predetermined value of current flow in common through said first and second output transistors comprises a pair of field effect transistors of opposite conductivity type having their respective gate and drain electrodes connected together and having their current paths connected in series between the gate electrodes of the pair of transistors in said control current path.

* * * * *